United States Patent
Nakano et al.

(10) Patent No.: US 10,600,770 B2
(45) Date of Patent: Mar. 24, 2020

(54) SEMICONDUCTOR DICE ASSEMBLIES, PACKAGES AND SYSTEMS, AND METHODS OF OPERATION

(71) Applicant: Micron Technology, Inc., Boise, ID (US)

(72) Inventors: Eiichi Nakano, Boise, ID (US); Shiro Uchiyama, Hino Tokyo (JP)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 15/978,778

(22) Filed: May 14, 2018

(65) Prior Publication Data
US 2019/0348406 A1 Nov. 14, 2019

(51) Int. Cl.
| | |
|---|---|
| *G11C 5/02* | (2006.01) |
| *H01L 25/18* | (2006.01) |
| *H01L 25/00* | (2006.01) |
| *H01L 23/367* | (2006.01) |
| *H01L 23/48* | (2006.01) |
| *H01L 23/538* | (2006.01) |

(52) U.S. Cl.
CPC ............ *H01L 25/18* (2013.01); *H01L 23/367* (2013.01); *H01L 23/481* (2013.01); *H01L 23/5384* (2013.01); *H01L 25/50* (2013.01)

(58) Field of Classification Search
CPC ......... G11C 5/025; G11C 5/04; G11C 5/1063; G11C 11/4097; G11C 7/18
USPC ..................................................... 365/51, 63
See application file for complete search history.

(56) References Cited

U.S. PATENT DOCUMENTS

| | | |
|---|---|---|
| 6,392,296 B1 | 5/2002 | Ahn et al. |
| 8,064,739 B2 | 11/2011 | Binkert et al. |
| 8,232,622 B2 | 7/2012 | Urakawa |
| 8,233,303 B2 | 7/2012 | Best et al. |
| 8,290,319 B2 | 10/2012 | Harada et al. |
| 8,821,040 B2 | 9/2014 | Bowen |
| 8,922,243 B2 | 12/2014 | Jayasena et al. |
| 9,094,135 B2 | 7/2015 | Pelley et al. |
| 9,158,081 B2 | 10/2015 | Jo et al. |
| 9,164,942 B2 | 10/2015 | Ken et al. |
| 9,201,777 B2 | 12/2015 | Hsu et al. |
| 9,263,424 B2 | 2/2016 | Tan |

(Continued)

FOREIGN PATENT DOCUMENTS

WO 2012058074 A3 5/2012

OTHER PUBLICATIONS

Byene et al., 3D System Integration Technology Choices and Challenges, SEMICON Europa (Oct. 7-9, 2014), 28 pages.

(Continued)

*Primary Examiner* — Son T Dinh
(74) *Attorney, Agent, or Firm* — TraskBritt

(57) ABSTRACT

A semiconductor device assembly, including an interposer comprising a glass material, a semiconductor die comprising a proximity coupling on a side of the interposer, and at least one other semiconductor die comprising a proximity coupling configured for communicating signals with the proximity coupling of the semiconductor die, on an opposing side of the interposer. The assembly may optionally be configured for optical signal communication with higher level packaging. Semiconductor device packages, systems and methods of operation are also disclosed.

13 Claims, 3 Drawing Sheets

(56) References Cited

U.S. PATENT DOCUMENTS

| | | |
|---|---|---|
| 9,299,689 B2 | 3/2016 | Oh |
| 9,449,653 B2 | 9/2016 | Kim et al. |
| 9,595,513 B2 | 3/2017 | Fogal et al. |
| 9,633,983 B2 | 4/2017 | Tan |
| 9,804,996 B2 | 10/2017 | O'Connor et al. |
| 2009/0089466 A1 | 4/2009 | Cunningham et al. |
| 2009/0315157 A1 | 12/2009 | Drost et al. |
| 2013/0285261 A1 | 10/2013 | Tan |
| 2014/0193115 A1 | 7/2014 | Popovic |
| 2014/0363172 A1 | 12/2014 | Pelley et al. |
| 2015/0010269 A1 | 1/2015 | Jo et al. |
| 2015/0091179 A1* | 4/2015 | Shenoy ............... H01L 23/5381 257/774 |
| 2015/0187436 A1* | 7/2015 | Querbach ............ G06F 11/263 714/720 |
| 2015/0242308 A1 | 8/2015 | Kim et al. |
| 2017/0140821 A1* | 5/2017 | Mazed ................. G11C 13/047 |
| 2017/0140947 A1* | 5/2017 | Tsai ....................... H01L 23/60 |

OTHER PUBLICATIONS

Choe et al., Comparison of Thermal Performance Between Glass and Silicon Interposers, Electronic Components and Technology Conferenct (ECTC), 2013 IEEE 63rd, May 28-31, 2013, abstract only.
Shorey, PhD, Aric B. Glass Interposer Substrates: Fabrication, Characterization and Modeling, Corning SIP Global Summit, (2013), 23 pages.

* cited by examiner

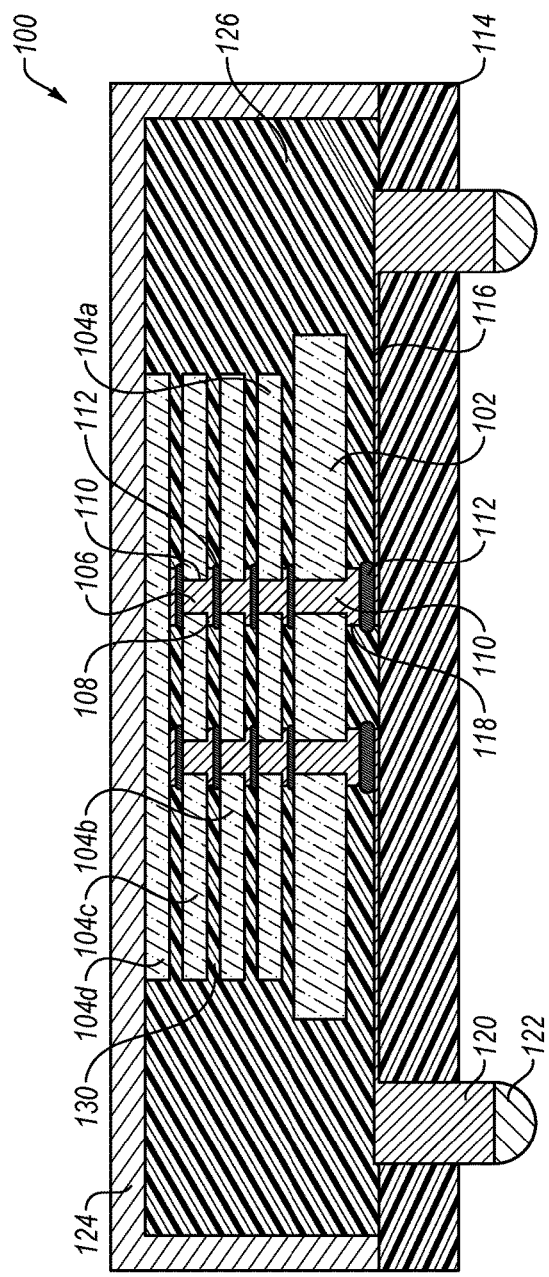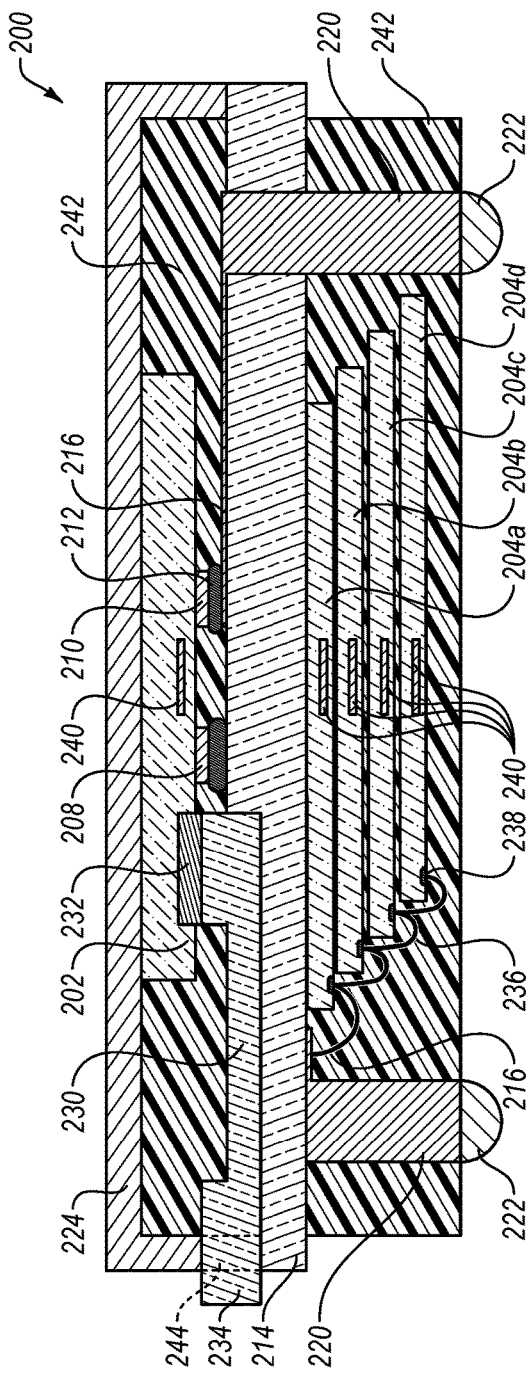

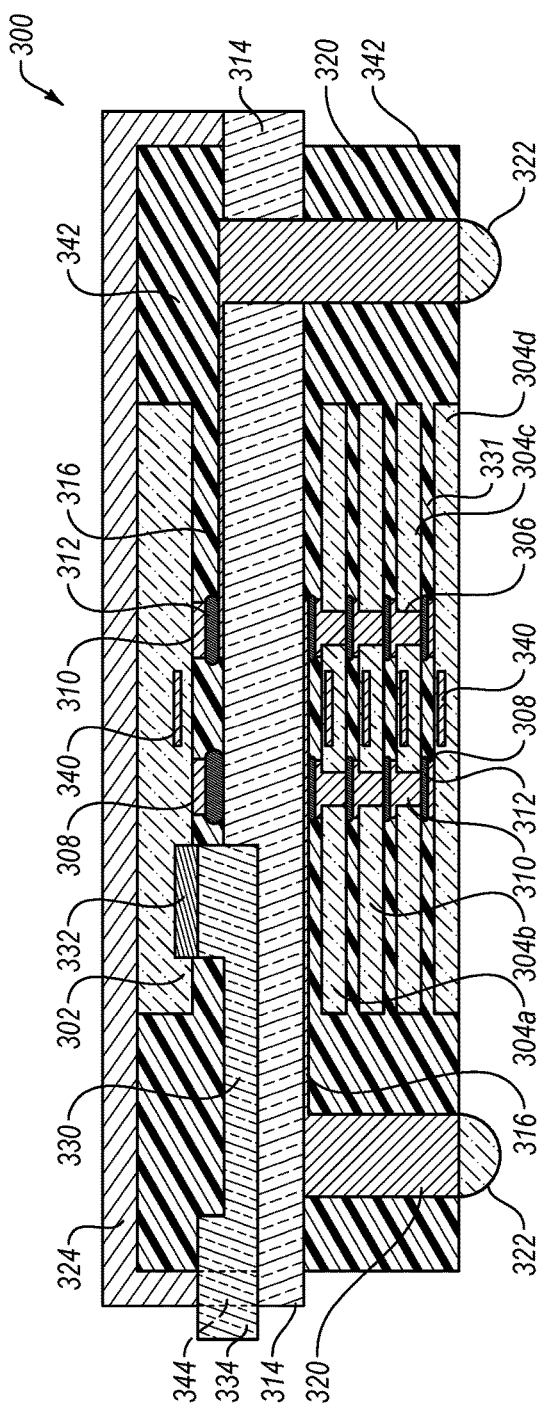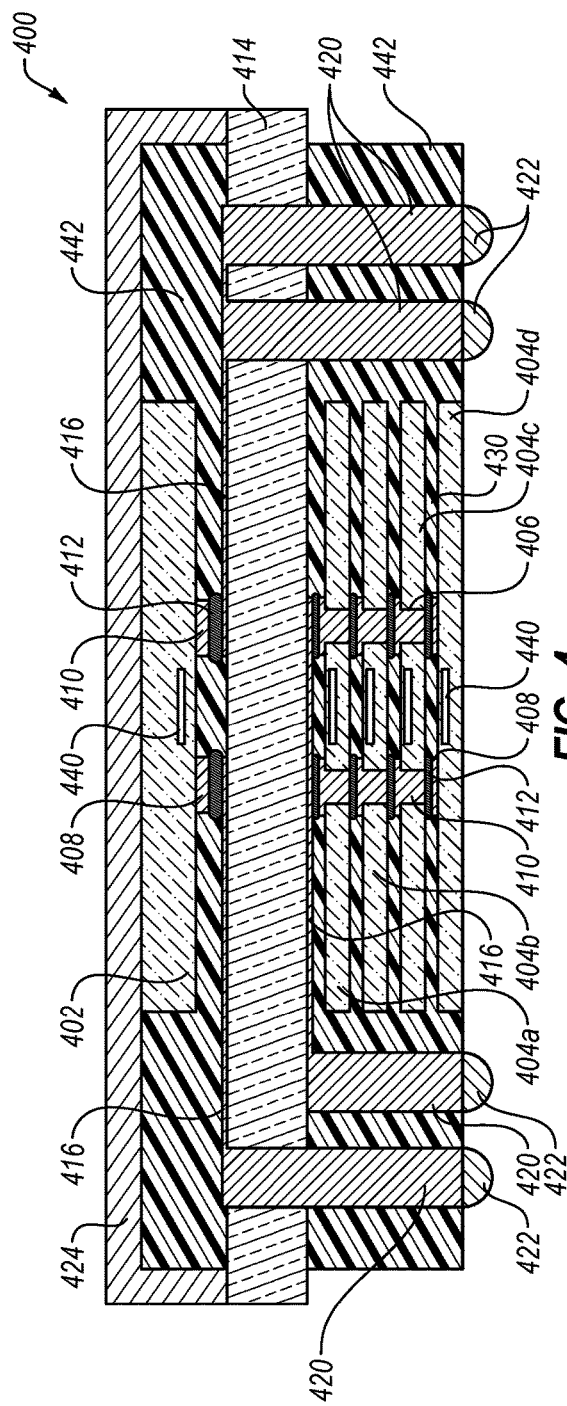

SEMICONDUCTOR DICE ASSEMBLIES, PACKAGES AND SYSTEMS, AND METHODS OF OPERATION

TECHNICAL FIELD

Embodiments disclosed herein relate to assemblies of semiconductor dice, packages and systems incorporating same, and methods of operation. More particularly, embodiments disclosed herein relate to assemblies of semiconductor dice exhibiting enhanced thermal isolation between at least one relatively higher power semiconductor die comprising a heat source during operation, and at least one other semiconductor die in such an assembly, the exposure of which to heat from the at least one semiconductor die may cause the temperature of the at least one other semiconductor die to exceed a threshold above which operation and longevity of the at least one other semiconductor die may be compromised.

BACKGROUND

The semiconductor industry continuously progresses toward the use of semiconductor die assemblies and packages exhibiting ever-smaller footprints (i.e., length and width), as well as heights. Such progress frequently entails the use of so-called "3-D" assemblies and packages, wherein a number of semiconductor dice are assembled in a stack. Initially, such die stacks, for example, stacks of memory dice in the form of dynamic random access memory (DRAM) included only a single type of die. However, more recently it has been recognized as desirable to incorporate a logic die with a stack of DRAM dice, such an assembly and package sometimes being referred to as a "hybrid memory cube."

While such assemblies and packages of DRAM with logic are, in theory, an improvement in the state of the art, practical implementation of such assemblies and packages has been difficult due to the relatively high heat output of the logic die, which is transferred to the adjacent DRAM in the assembly by conduction through the semiconductor material of the adjacent dice and, perhaps as significantly, through so-called "through silicon vias," or "TSVs," comprising conductive vias in the DRAM dice and conductive pillars extending between the adjacent DRAM die and the logic die as well as between the adjacent DRAM die and other DRAM dice in the stack which may comprise, for example, four, eight, twelve or some other number of DRAM dice.

FIG. 1 is a schematic cross-sectional view of a potential configuration of a 3-D package 100 comprising a logic die 102 and four DRAM dice 104a-104d stacked thereon. The 3-D package 100 as illustrated herein and described below is by way of example only, has not been produced by the assignee of the present disclosure and is not admitted to be prior art. As shown, all dice but the top DRAM die 104d have TSVs 106 extending therethrough. The TSVs 106 are, in turn, mutually connected by external connection elements 108 for signal, power and ground/bias connections between logic die 102 and the various DRAM dice 104a-104d. In the illustrated package 100, external connection elements 108 may comprise copper pillars 110 with solder caps 112.

The logic die 102 is mounted to an interposer 114, which may comprise silicon. Interposer 114 includes conductive traces 116 on a surface thereof facing logic die 102, and logic die 102 is operably coupled to distal ends of conductive traces 116 with external connection elements 118, which may comprise copper pillars 110 with solder caps 112. Conductive traces 116 extend to copper posts 120 extending through interposer 114 and protruding therefrom on a surface opposing that on which conductive traces 116 are located, copper posts 120 being capped with solder 122 for use in connecting the interposer 114 to higher-level packaging, for example a motherboard or other circuit board.

Heat spreader 124, which may comprise any suitable material, such as a metal or metal alloy, extends over DRAM dice 104a-104d and logic die 102 in operable heat-transferring contact with uppermost DRAM die 104d and contacts interposer 114 along a lateral periphery thereof. A thermal interface material (TIM) (not shown) may, optionally, be interposed between the DRAM die 104d and an inner surface of the heat spreader. Within heat spreader 124, DRAM dice 104a-104d and logic die 102 are encapsulated with a dielectric molding compound 126. Volumes between the various DRAM dice 104a-104d and logic die 102 and surrounding external connection elements 108 may, prior to encapsulation, be filled with a dielectric capillary underfill, a non-conductive paste or a non-conductive film 130.

Such a package as described above may exhibit operational temperatures in excess of specification for both logic die 102 and DRAM dice 104a-104d. More specifically, $T_{max}$ for logic die 102 should be maintained under about 105° C., while $T_{max}$ for DRAM dice 104a-104d should be maintained under about 95° C. However, with 3-D package 100 configured as described above, logic die 102 may exhibit an operating temperature of, for example, in excess of 127° C., while DRAM die 104a may exhibit an operating temperature of about 109° C., both such temperatures being well in excess of specification.

Various approaches have been proposed to mitigate the excessive heat generated by a logic die, including the use of complex heat sink or spreader structures, as well as active package cooling. However, it would be desirable to implement an effective, passive thermal isolation architecture for any die assembly or package requiring control of excessive heat generated by a semiconductor die of such assembly or package.

BRIEF DESCRIPTION OF THE DRAWINGS

FIG. 1 is a schematic cross-sectional view of a conventional 3-D package comprising a logic die and a stack of DRAM dice;

FIG. 2 is a schematic cross-sectional view of a first embodiment of a 3-D package comprising a logic die and a stack of DRAM dice according to the disclosure;

FIG. 3 is a schematic cross-sectional view of a second embodiment of a 3-D package comprising a logic die and a stack of DRAM dice according to the disclosure;

FIG. 4 is a schematic cross-sectional view of a third embodiment of a 3-D package comprising a logic die and a stack of DRAM dice according to the disclosure.

DETAILED DESCRIPTION

Figure 5:
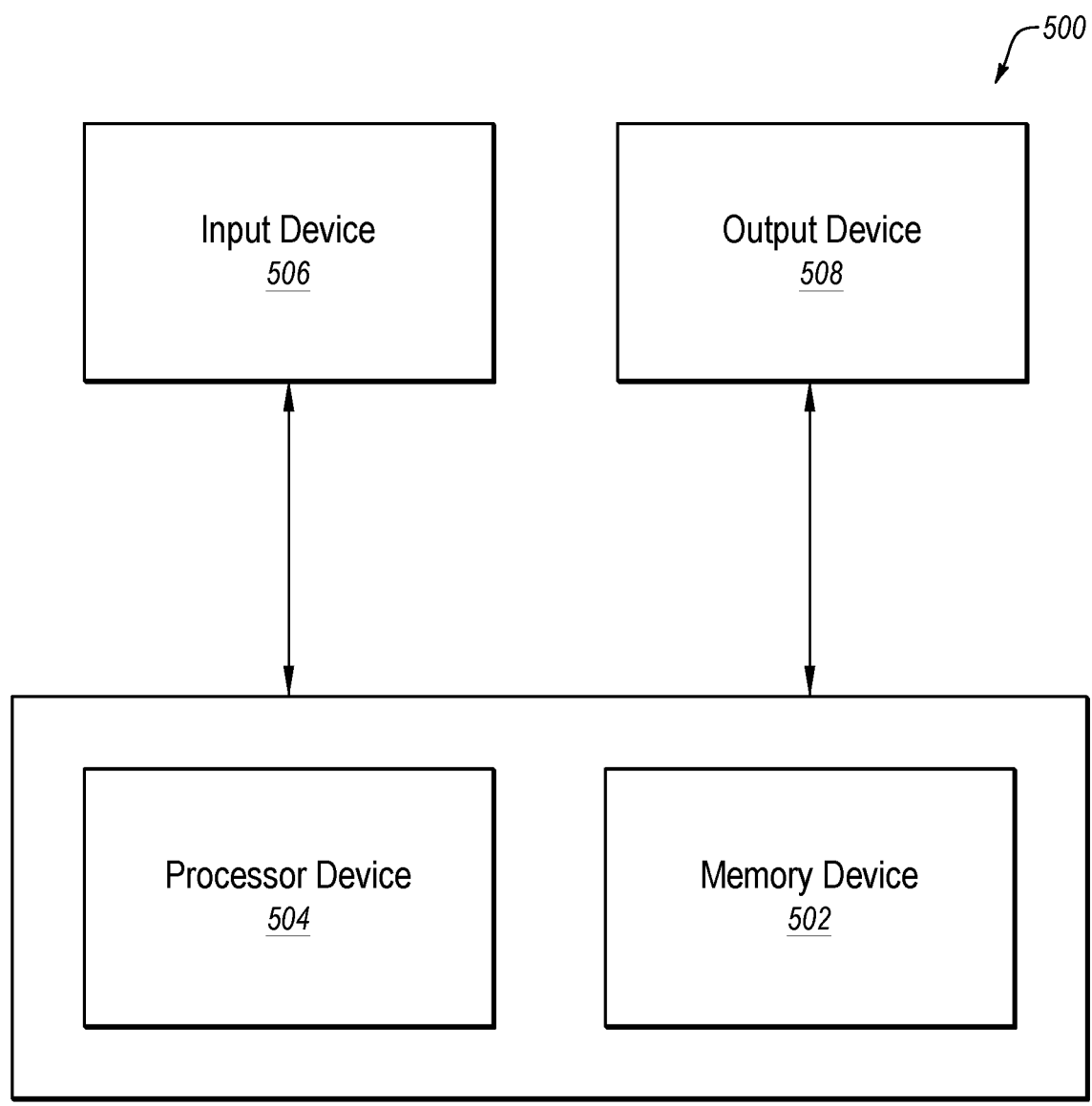
FIG. 5 is a schematic block diagram of a system incorporating at least one 3-D package according to one or more of the first, second or third embodiments.

Semiconductor die assemblies and packages are described and illustrated herein, the assemblies and packages comprising at least one relatively higher power die and at least one other die susceptible to structural and/or functional damage responsive to exposure to heat generated by operation of the at least one die.

In embodiments, a relatively higher power die in the form of a logic die and multiple other, heat-sensitive dice in the form of a DRAM stack, are incorporated in a package wherein the logic die is separated from the DRAM stack by a glass interposer, and signal connections between the logic die and the dice of the DRAM stack and between the dice of the DRAM stack are effected by proximity coupling.

The following description provides specific details, such as sizes, shapes, material compositions, and orientations in order to provide a thorough description of embodiments of the disclosure. However, a person of ordinary skill in the art would understand that the embodiments of the disclosure may be practiced without necessarily employing these specific details. Embodiments of the disclosure may be practiced in conjunction with conventional fabrication techniques employed in the industry. In addition, the description provided below does not form a complete process flow for manufacturing a 3-D semiconductor assembly, a 3-D package including a 3-D semiconductor assembly, a system including a 3-D package or methods of fabricating any of the foregoing apparatus according to embodiments of the disclosure. Only those process acts and structures necessary to understand the embodiments of the disclosure are described in detail below. Additional acts to form a complete 3-D semiconductor assembly, a complete 3-D package including a 3-D semiconductor assembly, or a complete system including a 3-D semiconductor package from the structures described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof. As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be, excluded.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "about" in reference to a given parameter is inclusive of the stated value and has the meaning dictated by the context (e.g., it includes the degree of error associated with measurement of the given parameter).

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "proximity coupling" means and includes signal coupling between components of a semiconductor die assembly, effected without physical signal conduction. Non-limiting examples of proximity coupling include inductive coupling and capacitive coupling.

As used herein, the specific term "glass" means and includes, by way of non-limiting example, aluminosilicate glass, and borosilicate glass. Glass interposers exhibit a low total thickness variation (TTV), relatively low warpage and bowing characteristics, excellent strength and planarity, a coefficient of thermal expansion (CTE) matching that of silicon, as well as good chemical durability and good electrical (dielectric) properties. In addition to glasses, other suitable insulating materials exhibiting properties desirable for interposer applications according to embodiments of the disclosure include, by way of non-limiting example, silicon nitride and silicon carbide. Accordingly, the term "glass material" as used herein means and includes glasses and other insulating materials suitable for use as interposers in implementation of embodiments of the disclosure and which do not compromise signal transmission for proximity coupling therethrough.

FIG. 2 is a schematic cross-sectional view of a 3-D package 200 according to a first embodiment of the disclosure. 3-D package 200 includes a logic die 202 and, by way of non-limiting example, four DRAM dice 204a-204d. Logic die 202 is located on one side of interposer 214, which comprises a glass material and DRAM dice 204a-204d are located on the opposing side of interposer 214. Suitable glass interposer materials are available, for example, from Corning, Incorporated, Asahi Glass Co., LTD, and Schott Glass North America. Each of logic die 202 and DRAM dice 204a-204d comprises proximity coupling interconnects 240 for communication of signals between the various dice, including between logic die 202 and at least the nearest DRAM die 204a through the thickness of interposer 214. In one embodiment, proximity coupling interconnects may comprise inductive couplings including conductive coil patterns to induce magnetic flux between adjacent dice for signal transmission and receipt. In another embodiment, the proximity coupling interconnects may comprise capacitive couplings, wherein capacitive plates are located in adjacent dice, and an electric field between the capacitive plates is employed as a medium through which signals may be transmitted between dice. In a further embodiment, both types of proximity coupling interconnects may be used in the assembly. For example, capacitive couplings may be used between closely adjacent DRAM dice 204a-204d, while DRAM die 204a may also comprise an inductive coupling for communication of signals with logic die 202, also equipped with capacitive coupling structure. Of course, for purposes of efficiency and simplicity, it may be desirable in some embodiments to employ only a single form of proximity coupling interconnect, and specifically inductive coupling due to distance limitations of capacitive coupling which may preclude the use of capacitive coupling in light of the presence of glass material interposer 214 between logic die 202 and most adjacent DRAM die 204a.

Interposer 214 includes an optical waveguide 230 which communicates with optical I/O 232 of logic die 202 at one end thereof, and which extends to socket 234 at another end thereof for communication with higher-level packaging. Interposer 214 carries a first group of conductive traces 216 on a surface thereof facing logic die 202, to which logic die 202 is operably coupled at distal ends thereof to provide power and ground/bias connections to higher-level packaging, for example, a motherboard or other circuit board, through external connection elements 208, which may comprise copper pillars 210 with solder caps 212. The proximal ends of conductive traces 216 of the first group extend respectively to a first group of copper posts 220 extending through interposer 214 and protruding therefrom on a surface opposing that on which conductive traces 216 of the first group are located, copper posts 220 bearing solder caps 222 for effecting connections to the higher-level packaging. Interposer 214 carries a second group of conductive traces 216 on a surface thereof facing DRAM dice 204a-204d, distal ends of conductive traces 216 of the second group comprising terminal pads to which wire bonds 236 are secured, wire bonds 236 extending to bond pads 238 on active surfaces of each of DRAM dice 204a-204d adjacent edges of each DRAM die 204a-204d facing the second group of conductive traces 216. As shown, DRAM dice 204a-204d are stacked in a mutually offset fashion to form a stair-step structure, wherein bond pads on each "tread" of the structure are exposed for wire bonding. Proximal ends of the second group of conductive traces 216 extend respectively to a second group of copper posts 220 with solder caps 222 protruding from the surface of interposer 214 facing DRAM dice 204a-204d. Wire bonds 236, the second group of conductive traces 216 and the second group of copper posts 220 provide power and ground/bias connections to higher-level packaging.

Logic die 202 and DRAM dice 204a-204d are each encapsulated in a dielectric molding compound 242 on opposing sides of interposer 214. In some embodiments, the dielectric molding compound 242 may be dispensed, as by molding, in a single application and comprise an electrically insulating and thermally conductive material (e.g., exhibiting a thermal conductivity of about 0.5 W/m·K, 1 W/m·K, 1.5 W/m·K, 2 W/m·K, 2.5 W/m·K, 3 W/m·K or more, or in any range defined by such thermal conductivities). Suitable encapsulation materials 242 are commercially available, for example, from Sumitomo Plastics America, Inc. of Santa Clara, Calif. On the logic die side of interposer 214, a heat spreader 224, which may comprise a metal, metal alloy, ceramic or other suitable material, extends over and in contact with logic die 202 through an optional TIM material, and is secured by an adhesive material to the surface of interposer 214 proximate a periphery thereof, surrounding the top and sides of the portion of molding compound 242 on the logic die side of interposer 214. External connection elements 208, the first group of conductive traces 216 and surfaces of optical waveguide 230 are also encapsulated. Socket 234 extends through and beyond an aperture 244, indicated in broken lines, in heat spreader 224 adjacent to interposer 214. Dielectric molding compound 242 also encapsulates DRAM dice 204a-204d as previously noted, as well as wire bonds 236 and the second group of copper posts 220. At least the solder caps 222 protrude beyond molding compound 242.

FIG. 3 is a schematic cross-sectional view of a 3-D package 300 according to a second embodiment of the disclosure. 3-D package 300 includes a logic die 302 and, by way of non-limiting example, four DRAM dice 304a-304d. Logic die 302 is located on one side of interposer 314, which comprises a glass material, while DRAM dice 304a-304d are located on the opposite side thereof. Each of logic die 302 and DRAM dice 304a-304d comprises proximity coupling interconnects 340 for communication of signals between the various dice. In one embodiment, proximity coupling interconnects may comprise inductive couplings including conductive coil patterns to induce magnetic flux between adjacent dice for signal transmission and receipt. In another embodiment, the proximity coupling interconnects may comprise capacitive couplings, wherein capacitive plates are located in adjacent dice, and an electric field between the capacitive plates is employed as a medium through which signals may be transmitted between dice. In a further embodiment, both types of proximity coupling interconnects may be used in the assembly. For example, capacitive couplings may be used between closely adjacent DRAM dice 304a-304d, while DRAM die 304a may also comprise an inductive coupling for communication of signals with logic die 302, also equipped with capacitive coupling structure. Of course, for purposes of efficiency and simplicity, it may be desirable in some embodiments to employ only a single form of proximity coupling interconnect, and specifically inductive coupling due to distance limitations of capacitive coupling which may preclude the use of capacitive coupling in light of the presence of glass material interposer 314 between logic die 302 and most adjacent DRAM die 304a.

Interposer 314 includes an optical waveguide 330 which communicates with optical I/O 332 of logic die 302 at one end thereof, and which extends to socket 334 at another end thereof for communication with higher-level packaging. Interposer 314 carries a first group of conductive traces 316 on a surface thereof facing logic die 302, to which logic die 302 is operably coupled at distal ends thereof to provide power and ground/bias connections to higher-level packaging, for example, a motherboard or other circuit board, through external connection elements 308, which may comprise copper pillars 310 with solder caps 312. The proximal ends of conductive traces 316 of the first group extend respectively to a first group of copper posts 320 extending through interposer 314 and protruding therefrom on a surface opposing that on which conductive traces 316 of the first group are located, copper posts 320 being capped with solder caps 322 for effecting connections to the higher-level packaging. Interposer 314 carries a second group of conductive traces 316 on a surface thereof facing DRAM dice 304a-304d, distal ends of conductive traces 316 of the second group extending over active surface of DRAM die 304a. As shown, each of DRAM dice 304a-304c of DRAM dice 304a-304d includes TSVs 306 and all of DRAM dice 304a-304d are stacked in a mutually superimposed fashion and interconnected with TSVs 306, external connection elements 308 comprising copper pillars 310 with solder caps 312, DRAM die 304a being similarly connected by external connection elements 308 to distal ends of conductive traces 316 of the second group. Proximal ends of the second group of conductive traces 316 extend respectively to a second group of copper posts 320 with solder caps 322 protruding from the surface of interposer 314 facing DRAM dice 304a-304d. TSVs 306, external connection elements 308, the second group of conductive traces 316 and the second group of copper posts 320 provide DRAM dice 304a-304d with power and ground/bias connections to higher-level packaging.

Logic die 302 and DRAM dice 304a-304d are each encapsulated in a dielectric molding compound 342 on opposing sides of interposer 314. In some embodiments, the dielectric molding compound 342 may be dispensed, as by molding, in a single application and comprise an electrically insulating and thermally conductive material (e.g., exhibiting a thermal conductivity of about 0.5 W/m·K, 1 W/m·K, 1.5 W/m·K, 2 W/m·K, 2.5 W/m·K, 3 W/m·K or more, or in any range defined by such thermal conductivities). Suitable encapsulation materials 342 are commercially available, for example, from Sumitomo Plastics America, Inc. of Santa Clara, Calif. Volumes between the various DRAM dice 304a-304d and between DRAM die 304a and interposer 314, and surrounding external connection elements 308 may, prior to encapsulation, be filled with a dielectric capillary underfill, a non-conductive paste or a non-conductive film 331.

On the logic die side of interposer 314, a heat spreader 324, which may comprise a metal, metal alloy, ceramic or other suitable material, extends over and in contact with logic die 302 through an optional TIM material and secured to the surface of interposer 314 proximate a periphery thereof by an adhesive material, surrounding the top and sides of the portion of molding compound 342 on the logic die side of interposer 314. External connection elements 308, the first group of conductive traces 316 and surfaces of optical waveguide 330 are also encapsulated. Socket 334 extends through and beyond an aperture 344, indicated in broken lines, in heat spreader 324 adjacent to interposer 314. Dielectric molding compound 342 also encapsulates DRAM dice 304a-304d as previously noted, as well as external connection elements 308, the second group of conductive traces 316 and the second group of copper posts 320. At least the solder caps 322 protrude beyond molding compound 342. Unlike as shown in FIG. 2, a back side of DRAM die 304d may be exposed in substantially planar relationship with the surrounding surface of molding compound 342, being covered with a passivation material to prevent shorting.

FIG. 4 is a schematic cross-sectional view of a 3-D package 400 according to a third embodiment of the disclosure. 3-D package 400 includes a logic die 402 and, by way of non-limiting example, four DRAM dice 404a-404d. Logic die 402 is located on one side of interposer 414, which comprises a glass material, while DRAM dice 404a-404d are located on the opposite side thereof. Each of logic die 402 and DRAM dice 404a-404d comprises proximity coupling interconnects 440 for communication of signals between the various dice. In one embodiment, proximity coupling interconnects 440 may comprise inductive couplings including conductive coil patterns to induce magnetic flux between adjacent dice for signal transmission and receipt. In another embodiment, the proximity coupling interconnects may comprise capacitive couplings, wherein capacitive plates are located in adjacent dice, and an electric field between the capacitive plates is employed as a medium through which signals may be transmitted between dice. In a further embodiment, both types of proximity coupling interconnects may be used in the assembly. For example, capacitive couplings may be used between closely adjacent DRAM dice 404a-404d, while DRAM die 404a may also comprise an inductive coupling for communication of signals with logic die 402, also equipped with capacitive coupling structure. Of course, for purposes of efficiency and simplicity, it may be desirable in some embodiments to employ only a single form of proximity coupling interconnect, and specifically inductive coupling due to distance limitations of capacitive coupling which may preclude the use of capacitive coupling in light of the presence of glass material interposer 414 between logic die 402 and most adjacent DRAM die 404a.

Interposer 414 carries a first group of conductive traces 416 on a surface thereof facing logic die 402, to which logic die 402 is operably coupled at distal ends thereof to provide signal, power and ground/bias connections to higher-level packaging, for example a motherboard or other circuit board, through external connection elements 408, which may comprise copper pillars 410 with solder caps 412. The proximal ends of conductive traces 416 of the first group extend respectively to a first group of copper posts 420 extending through interposer 414 and protruding therefrom on a surface opposing that on which conductive traces 416 of the first group are located, copper posts 420 being capped with solder caps 422 for effecting connections to the higher-level packaging. Interposer 414 carries a second group of conductive traces 416 on a surface thereof facing DRAM dice 404a-404d, distal ends of conductive traces 416 of the second group extending over active surface of DRAM die 404a. As shown, each of DRAM dice 404a-404c of DRAM dice 404a-404d includes TSVs 406 and all of DRAM dice 404a-404d are stacked in a mutually superimposed fashion and interconnected with TSVs 406 and external connection elements 408 comprising copper pillars 410 with solder caps 412, DRAM die 404a being similarly connected by external connection elements 408 to distal ends of conductive traces 416 of the second group. Proximal ends of the second group of conductive traces 416 extend respectively to a second group of copper posts 420 protruding from the surface of interposer 414 facing DRAM dice 404a-404d. TSVs 406, external connection elements 408, the second group of conductive traces 416 and the second group of copper posts 420 provide DRAM dice 404a-404d with signal, power and ground/bias connections to higher-level packaging.

Logic die 402 and DRAM dice 404a-404d are each encapsulated in a dielectric molding compound 442 on opposing sides of interposer 414. Volumes between the various DRAM dice 404a-404d and between DRAM die 404a and interposer 414, and surrounding external connection elements 408 may, prior to encapsulation, be filled with a dielectric capillary underfill, a non-conductive paste or a non-conductive film 430.

On the logic die side of interposer 414, a heat spreader 424, which may comprise a metal, metal alloy, ceramic or other suitable material, extends over and in contact with logic die 402 through an optional TIM material and to the surface of interposer 414 proximate a periphery thereof, surrounding the top and sides of the portion of molding compound 442 on the logic die side of interposer 414. External connection elements 408 and the first group of conductive traces 416 are also encapsulated. Dielectric molding compound 442 also encapsulates DRAM dice 404a-404d as previously noted, as well as external connection elements 408, the second group of conductive traces 416 and the second group of copper posts 420. At least the solder caps 422 protrude beyond molding compound 442. Unlike as shown in FIG. 2, a back side of DRAM die 404d may be exposed in substantially planar relationship with the surrounding surface of molding compound 442, being covered with a passivation material to prevent shorting.

Semiconductor devices (e.g., the semiconductor device packages 200, 300, 400) including semiconductor device structures (e.g., logic and DRAM dice) in accordance with embodiments of the disclosure may be used in embodiments of electronic systems of the disclosure. For example, FIG. 5 is a block diagram of an illustrative electronic system 500 according to embodiments of disclosure. The electronic system 500 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 500 includes at least one memory device 502. The memory device 502 may include, for example, an embodiment of a semiconductor device previously described herein (e.g., semiconductor device package 200, 300, 400). The electronic system 500 may further include at least one electronic signal processor device 504 (often referred to as a "microprocessor"). The electronic system 500 may further include one or more input devices 506 for inputting information into the electronic system 500 by a user, such as, for example, a mouse or other pointing device, a keyboard, a touchpad, a button, or a control panel. The electronic system 500 may further include one or more output devices 508 for outputting information (e.g., visual or audio output) to a user such as, for example, a monitor, a display, a printer, an audio output jack, a speaker, etc. In some embodiments, the input device 506 and the output device 508 may comprise a single touchscreen device that can be used both to input information to the electronic system 500 and to output visual information to a user. The input device 506 and the output device 508 may communicate electrically with one or more of the memory device 502 and the electronic signal processor device 504.

Thus, it will be appreciated by those of ordinary skill in the art that embodiments of the disclosure provide enhanced thermal isolation between a relatively higher power die and other dice in a semiconductor assembly by use of a glass material interposer and by elimination of TSVs and metal (e.g., copper) pillars extending between adjacent dice. In addition, use of appropriate proximity coupling techniques, such as inductive coupling, alone and in combination with optical communication from the logic die to higher level packaging, may enable signal communication speed and bandwidth equivalent or superior to the use of conventional, metal electrical conduction structure.

It will also be appreciated by those of ordinary skill in the art that, while embodiments of the disclosure have been described in the context of a semiconductor device comprising DRAM and logic dice, the disclosure is not so limited. For example, embodiments may employ other relatively high power semiconductor dice in combination with memory including, for example, NAND flash memory. Further, any assemblies employing dice with CMOS transistors is susceptible to compromised life and operation due to thermal issues, and would benefit from implementation in accordance with embodiments of the disclosure.

In some embodiments, an assembly comprises an interposer comprising a glass material, a semiconductor die comprising a proximity coupling on a side of the interposer, and at least one other semiconductor die comprising a proximity coupling configured for communicating signals with the proximity coupling of the semiconductor die, on an opposing side of the interposer.

In other embodiments, a semiconductor device package comprises an interposer comprising a glass material, a logic die on a side of the interposer, a stack of DRAM dice on an opposing side of the interposer, each of the logic die and the DRAM dice configured with proximity couplings for mutual signal communication among and between the logic dice and the DRAM die. Conductive traces on the side of the interposer for communicating power and ground/bias to the logic die extend to conductive structures terminating externally to the package, and other conductive traces on the opposing side of the interposer for communicating power and ground/bias to the DRAM dice extend to conductive structures terminating externally to the package. Dielectric molding compound encapsulates the logic die and the DRAM dice and a heat spreader extends over and is in thermally conductive contact with the logic die, the heat spreader extending to and in contact with the interposer proximate a periphery thereof. At least some of the conductive structures and the other conductive structures extend through the interposer and through a portion of the dielectric molding compound.

In further embodiments, a method of operating a semiconductor device comprises communicating signals between a logic die and one or more memory dice through proximity coupling, and communicating power and ground/bias with each of the logic die and the one or more memory dice with electrically conductive structure terminating external to the package.

In still further embodiments, an electronic system comprises an input device, an output device, a processor device operably coupled to the input device and the output device and a semiconductor device operably coupled to the processor device. The semiconductor device comprises a stack structure comprising a logic die, a stack of memory dice operably coupled to the logic die through proximity coupling and an interposer comprising a glass material located between the stack of memory dice and the logic die.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An assembly, comprising:
an interposer comprising a glass material;
a semiconductor die comprising a logic die having a proximity coupling on a side of the interposer; and
at least one other semiconductor die comprising a proximity coupling configured for
communicating signals with the proximity coupling of the semiconductor die, on an opposing side of the interposer, the at least one other die comprising a number of stacked memory dice, each of the logic die and the memory dice comprising a proximity coupling for mutual signal communication;
wherein:
the logic die is in electrically conductive communication with conductive traces of the interposer for communicating power and ground/bias;
the number of stacked memory dice comprises memory dice stacked in stair-step fashion with exposed bond pads on treads of stairs; and
further comprising wire bonds respectively extending from the exposed bond pads to conductive traces of the interposer for communicating power and ground/bias; and
the interposer comprises an optical waveguide for signal communication with an optical I/O of the logic die and extends to a socket for optical signal communication with higher level packaging.

2. The assembly of claim 1, further comprising additional structure for electrically conductively communicating power and ground/bias to the logic die and the number of stacked memory dice.

3. An assembly, comprising:
an interposer comprising a glass material;
a semiconductor die comprising a logic die having a proximity coupling on a side of the interposer; and
at least one other semiconductor die comprising a proximity coupling configured for
communicating signals with the proximity coupling of the semiconductor die, on an opposing side of the interposer, the at least one other die comprising a number of stacked memory dice, each of the logic die and the memory dice comprising a proximity coupling for mutual signal communication, wherein:
the logic die is in electrically conductive communication with conductive traces of the interposer for communicating power and ground/bias;
the number of stacked memory dice comprises memory dice stacked in vertical alignment;
TSVs and conductive pillars extend between the stacked memory dice and conductive traces of the interposer, the TSVs, conductive pillars and the conductive traces in combination for communicating power and ground/bias to the memory dice; and
the interposer comprises an optical waveguide for signal communication with an optical I/O of the logic die and extends to a socket for optical signal communication with higher level packaging.

4. An assembly, comprising:
an interposer comprising a glass material;
a semiconductor die comprising a logic die having a proximity coupling on a side of the interposer; and
at least one other semiconductor die comprising a proximity coupling configured for
communicating signals with the proximity coupling of the semiconductor die, on an opposing side of the interposer, the at least one other die comprising a number of stacked memory dice, each of the logic die and the memory dice each comprising a proximity coupling for mutual signal communication, wherein:
the logic die is in electrically conductive communication with conductive traces of the interposer for communicating power and ground/bias;
the number of stacked memory dice comprises dice stacked in vertical alignment;
TSVs and conductive pillars extend between the number of stacked memory dice and conductive traces of the interposer, the TSVs, the conductive pillars and the conductive traces in combination for communicating power and ground/bias to the memory dice; and
the interposer comprises conductive traces for signal communication with the logic die, the conductive traces extending to conductive structure for signal communication with higher-level packaging.

5. The assembly of claim 1, wherein the proximity couplings comprise inductive couplings.

6. A semiconductor device package, comprising:
an interposer comprising a glass material;
a logic die on a side of the interposer;
a stack of DRAM dice on an opposing side of the interposer;
each of the logic die and the DRAM dice configured with proximity couplings for mutual signal communication among and between the logic die and the DRAM dice;
conductive traces on the side of the interposer for communicating power and ground/bias to the logic die, the conductive traces extending to conductive structures terminating externally to the package;
other conductive traces on the opposing side of the interposer for communicating power and ground/bias to the DRAM dice, the other conductive traces extending to other conductive structures terminating externally to the package;
dielectric molding compound encapsulating the logic die and the DRAM dice; and
a heat spreader extending over and in thermally conductive contact with the logic die, the heat spreader extending to and in contact with the interposer proximate a periphery thereof;
at least some of the conductive structures and the other conductive structures extending through the interposer and through a portion of the dielectric molding compound.

7. The package of claim 6, wherein the interposer carries an optical waveguide in communication with an optical I/O of the logic die and with socket structure terminating externally to the package for signal communication with higher level packaging.

8. The package of claim 6, wherein the logic die is operably coupled to conductive traces on the side of the interposer extending to conductive structures terminating externally to the package for signal communication with higher level packaging.

9. The package of claim 6, wherein the DRAM dice are stacked in stair-step fashion with bond pads exposed on stair treads; and further comprising wire bonds respectively extending from the exposed bond pads to the conductive traces on the opposing side of the interposer.

10. The package of claim 6, wherein the DRAM dice are stacked in vertical alignment; and TSVs and conductive pillars extend between the DRAM dice and the conductive traces on the opposing side of the interposer.

11. The package of claim 6, wherein the proximity couplings comprise inductive couplings.

12. The assembly of claim 3, wherein the proximity couplings comprise inductive couplings.

13. The assembly of claim 4, wherein the proximity couplings comprise inductive couplings.

\* \* \* \* \*